Jan. 2, 1968 L. KEDSON ET AL 3,361,982
STABILIZED DIRECT COUPLED TRANSISTOR AMPLIFIER
HAVING LOW INTERMODULATION DISTORTION
Filed July 25, 1963
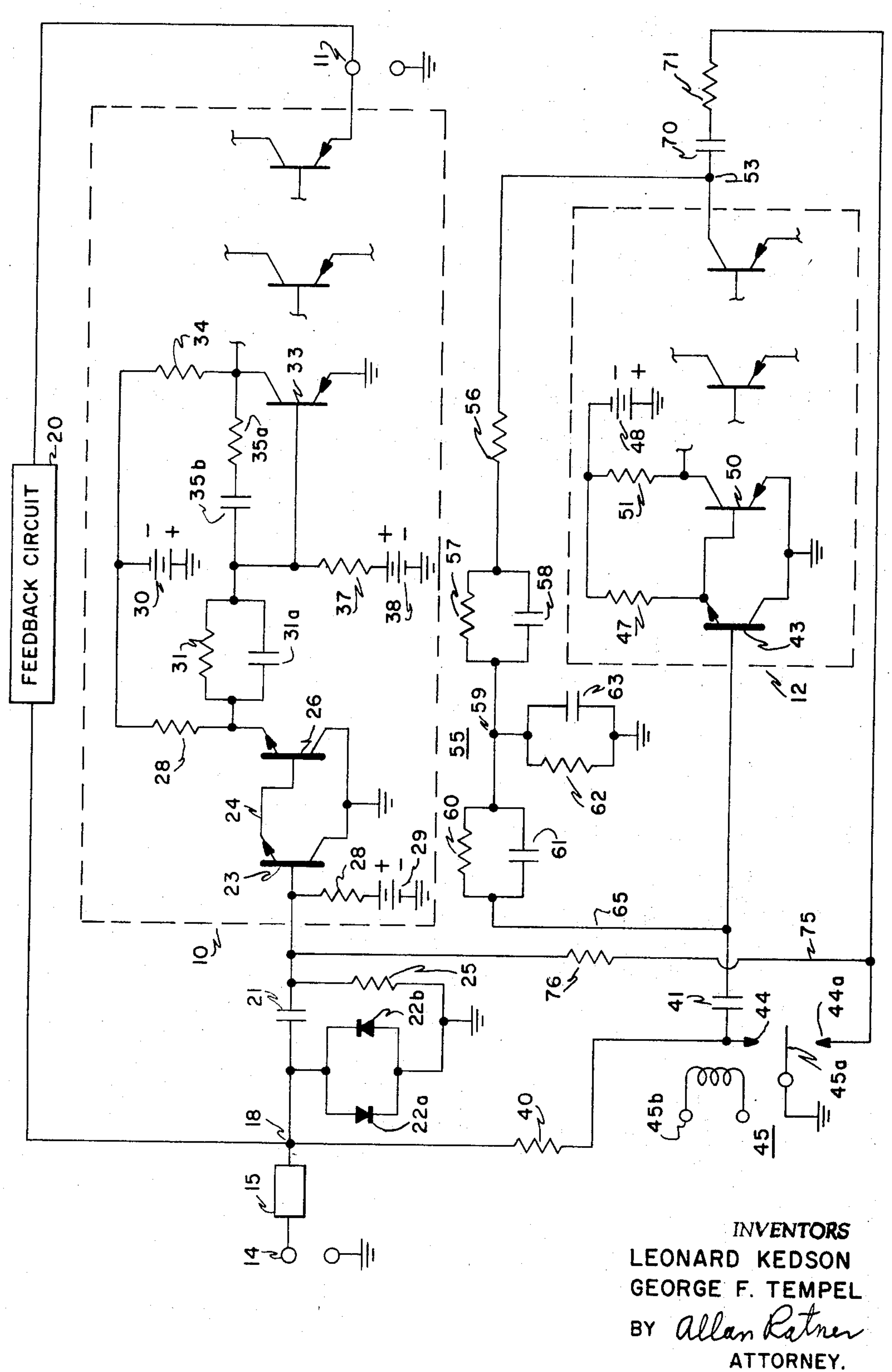
INVENTORS
LEONARD KEDSON
GEORGE F. TEMPEL
BY Allan Ratner
ATTORNEY.

United States Patent Office 3,361,982
Patented Jan. 2, 1968

3,361,982

STABILIZED DIRECT COUPLED TRANSISTOR AMPLIFIER HAVING LOW INTERMODULATION DISTORTION

Leonard Kedson, Elberon, and George F. Tempel, Irvington, N.J., assignors to Electronic Associates Inc., Long Branch, N.J., a corporation of New Jersey Filed July 25, 1963, Ser. No. 297,523
2 Claims. (Cl. 330—9)

This invention relates to electronic analog computing apparatus and has for an object the provision of a direct coupled amplifier system in which the dynamic errors and static errors are substantially decreased.

In conventional analog computing apparatus, predetermined variables are set by adjustment of selected voltages to correct initial conditions as defined by a problem to be solved. Computing elements are connected together and made operative to vary the selected voltages in accordance with desired equations. It is these slowly varying direct current voltage variations with respect to time which comprise the solution of a problem. It is known that the accuracy of the analog apparatus is limited by the accuracy of the computing elements or components. Since a majority of such computing elements comprise drift stabilized direct coupled amplifier systems, it is particularly important that such amplifiers have high accuracy and low overall error.

Conventional drift stabilized direct coupled amplifier systems (operational amplifiers) comprise a direct coupled amplifier connected together with a virtually driftless amplifier. Such a virtually driftless amplifier is obtained by converting the slowly varying direct current input signal to an A.C. voltage by means of a modulator, amplifying that A.C. voltage by an A.C. stabilizing amplifier, and then reconverting the resultant signal to direct current by a demodulating device. When the conventional direct coupled amplifier and the A.C. amplifier use transistors as their amplifying elements, dynamic and static errors and inaccuracies are introduced which adversely affect the operation of such amplifiers and have heretofore limited their use as high accuracy analog computing elements.

Accordingly, an object of the present invention is a direct coupled amplifier system having a direct coupled amplifier in which the input impedance is a relatively very high value thereby to decrease errors withous sacrificing gain.

Another object of the present invention is an A.C. stabilizing amplifier having a relatively high input impedance thereby to maintain the very high input impedance of the direct coupled amplifier and to provide high gain for the balancing amplifier.

In carrying out the invention in one form thereof, the conventional direct coupled amplifier has an input stage comprising two transistors connected in a compound emitter-follower configuration. As a result, the input impedance of the direct coupled amplifier is of a relatively very high value thereby to increase the frequency response and decrease the drift, noise and input base current of the amplifier system without decreasing its overall gain. In addition, the A.C. stabilizing amplifier has a transistor input stage connected as an emitter-follower to provide a relatively high input impedance thereby to maintain the very high input impedance of the direct coupled amplifier and to maintain a high gain for the stabilizing amplifier.

Further in accordance with the invention, there is provided a tuned frequency selective feedback network connected between the input and the output of the stabilizing amplifier to effectively decrease noise generated by and appearing at the output of the stabilizing amplifier.

In this manner, the noise applied from the stabilizing amplifier to the direct coupled amplifier is decreased. In addition, such feedback network minimizes undesirable instabilities and low frequency beat signals occurring in the closed circuit comprising the stabilizing amplifier and its respective interconnections with the direct coupled amplfier. By suppressing such undesirable effects, the amplifier system intermodulation distortion is maintained at a substantially low value.

For further objects and advantages of the invention and for a description of its operation, reference is to be had to the following detailed description taken in conjunction with the accompanying drawing, the single figure of which schematically illustrates a direct coupled amplifier system embodying the invention.

Referring now to the amplifier system illustrated in the figure there is shown within a rectangle 10 a schematic diagram of a direct coupled transistor amplifier having an output terminal 11. Within the rectangle 12 there is illustrated a resistance-capacitance coupled A.C. stabilizing amplifier.

A slowly varying direct current signal input may be applied to an input terminal 14 of the amplifier system which input is then conducted by way of an input circuit 15 to a summing junction 18. In addition, there is also applied to the summing junction 18 a feedback voltage from the output terminal 11 through a feedback circuit 20. As well understood in the art, an error voltage is produced at the summing junction 18 which is a potential difference between the signal input potential and the feedback potential. When a condition of perfect balance is achieved, the feedback signal very nearly cancels the input signal and the summing junction 18 is maintained at essentially ground potential.

The error voltage that is produced is applied by way of a direct current blocking capacitor 21 to the input of the direct coupled amplifier 10 and to the base of an NPN transistor 23. Transistor 23 is connected in an emitter-follower configuration and has its emitter directly connected by way of a conductor 24 to the base of an NPN transistor 26 also connected as an emitter-follower. To complete the emitter-follower connections, the collectors of transistors 23 and 26 are connected to ground potential and the emitter of transistor 26 is connected by way of resistor 28 to the negative side of a supply battery 30, the positive side of which is connected to ground. Thus, a slowly varying input signal applied to the input of transistor 23 is current amplified by that transistor to produce a corresponding signal of the same polarity at the conductor 24. That resultant signal is further current amplified by transistor 26 so that there appears at its emitter an output signal corresponding in waveform and in polarity to the input signal.

The emitter supply for transistor 23 may be traced from battery 30, resistor 28, the emitter and base of conductive transistor 26, conductor 24 and to the emitter of transistor 23. In addition, the bias supply potential for transistor 23 may be traced from its base through resistor 28 to the positive side of battery 29 the negative side of which is connected to ground. In view of the above, emitter-follower transistor 23 is directly connected in series circuit with emitter-follower transistor 26 to form a compound emitter-follower circuit. The input impedance of this circuit configuration is of a very high order of magnitude as for example, in a typical circuit the input impedance taken from the base of transistor 23 with respect to ground may be as high as several megohms. In this manner and in accordance with the invention, the input impedance of the direct coupled amplifier 10 is of a relatively very high value which is to be compared with conventional direct coupled transistor amplifier input impedance values which may be in the 10 kilohm range.

As a result of that very high input impedance, the capacitance value of the blocking capacitor 21 may be selected to be smaller than would otherwise be necessary in prior amplifiers. The reason for this is that the time constant for the circuit, including that capacitor, must be sufficient to have a very low frequency cut-off value. If the input impedance of amplifier 10 is increased, the value of such capacitance may be decreased while maintaining the same time constant. Thus, suitable polystyrene capacitors or high quality Mylar may be utilized which have the necessary capacitance values and also have the advantages of extremely low leakage currents, good dielectric properties and high leakage resistance. On the other hand, in prior transistor direct coupled amplifiers, the needed higher valued capacitors in order to be of small size consistent with transistor circuitry were constructed of tantalum or a similar dielectric which does not exhibit the foregoing advantages. In addition, a smaller valued capacitor 21 provides a rapid recovery from any overload appearing across the diodes as compared with higher valued capacitors.

As well known in the art, the static errors, the dynamic errors and response of a direct coupled amplifier system or operational amplifier may be calculated by using equations as found in the texts as for example in "Design Fundamentals of Analog Computer Components" by R. M. Howe, D. Van Nostrand Co., Inc., 1961 at pages 22 et. seq. In deriving these equations it has been assumed by the author that the input impedance of the direct coupled amplifier is infinite since these equations were derived for vacuum tube amplifiers. However, as previously described, in conventional direct coupled transistor amplifiers the input impedance is not infinite and may be in the 10 kilohm range. Thus, in FIGURES 2.2.1 and 2.2.2 of the foregoing text an input impedance $Z_{IN}$ should be considered as being connected across the input of the direct coupled amplifier which is from the summing junction to ground.

If in FIGURE 2.2.2 the amplifier gain is assumed to be —A and (1) $e$=any input voltage
(2) $Z_i$=any input impedance
(3) $i_i$=any input current$\equiv e_i/Z_i$ then from Kirchoff's current law, it can be shown following the Howe text that the current flowing toward the summing junction $$-i_1'=\frac{e_o-e'}{Z_f}+\frac{-e'}{Z_{IN}} \tag{4}$$

$$-i_1'=\frac{e_o}{Z_f}\left[1+\frac{1}{A}\left(1+\frac{Z_f}{Z_{IN}}\right)\right] \tag{5}$$

In addition that current also may be shown to be $$i_1'=\sum_1^n i_i=\sum_1^n\left(\frac{e_i}{Z_i}\right)-\sum_1^n\left(\frac{1}{Z_i}\right)e' \tag{6}$$

Solving and rearranging:

$$e_o=-Z_f\sum_1^n\left(\frac{e_i}{Z_i}\right)\left[\frac{1}{1+\frac{1}{A}\left[1+Z_f\left(\frac{1}{Z_{IN}}+\sum_1^n\frac{1}{Z}\right)\right]}\right] \tag{7}$$

$$e_o=-\frac{\frac{Z_f}{Z_1}e_1+\frac{Z_f}{Z_2}e_2+\cdots+\frac{Z_f}{Z_n}e_n+\frac{Z_f}{Z_{IN}}(0)}{1+\frac{1}{A}\left(1+\frac{Z_f}{Z_1}+\frac{Z_f}{Z_2}+\cdots+\frac{Z_f}{Z_n}+\frac{Z_f}{Z_{IN}}\right)} \tag{8}$$

Thus comparing Equations 7 and 8 with the equations of Howe, it will be understood that the input impedance $Z_{IN}$ may be considered to be an input impedance additional to the input impedances $Z_1, Z_2 \ldots Z_n$. In conventional transistor amplifiers the input impedance $Z_{IN}$ may be in the range of 10 kilohms and $Z_f, Z_1, Z_2 \ldots Z_n$ may each be several megohms. As a result, all of the terms within the brackets in the denominator of Equation 8 may be small values except for $Z_f/Z_{IN}$ which may be a large value. Thus the assumption in the above text would no longer be valid that the gain is much much greater than the sum of the terms within the brackets. Therefore, the usual basic Equation 2.2.1–6 of Howe no longer applies and in such case this generally indicates an increase in errors for the amplifier. These errors, both dynamic and static, are outlined below where it is described in detail that such errors are minimized in accordance with the invention by the provision of a relatively very high input impedance.

In the above text at page 29, in Equation 2.2.3–6 the term $R_i$ would comprise all of the input impedances connected effectively in parallel. With a relatively low conventional value of $Z_{IN}$ as described below, this term would be the dominant term and the resultant $R_i$ would then be relatively low. With such value of $R_i$, the time constant $T_S$ of the amplifier would be high and the frequency response low. However, in accordance with the invention, with a relatively very high valued input impedance the total value of $R_i$ would be very high and the frequency response would be increased accordingly. This same result is achieved when the operational amplifier is used as an integrator by applying Equation 2.2.4–6 at page 34. In addition, in the above text at pp. 42 and 106 et. seq., and the Equation 2.2.6–5 and 3.6.1–7, it may be seen that within the normal range of computing frequencies that drift and noise errors decrease as the input impedance increases. In addition, it will be seen that as the input impedance is increased the base current flow of the input transistor 23 is decreased.

It will be understood that all of the foregoing advantages are achieved without decreasing the gain of the operational amplifier. Thus, in accordance with the present invention, when the input impedance $Z_{IN}$ of the direct coupled amplifier is increased to a relatively very high value by the use of dual emitter-follower input transistors, dynamic and static errors are decreased while frequency response is increased without sacrificing gain.

The output of emitter-follower transistor 26 is applied by way of its emitter through the parallel connection of coupling resistor 31 and coupling capacitor **31*a* to the base of a PNP transistor 33** connected in a common-emitter configuration.

The collector supply for transistor 23 is supplied by way of battery 30 through resistor 34 to that collector which is also conected by way of an additional circuit coupling network comprising resistor **35*a* and capacitor 35*b* to the base of transistor 33. A bias battery 38 has its negative side grounded and its positive side connected by way of a resistor 37 to the base of transistor 33. As a result of these connections, transistor 33 is effective to amplify the signals applied to its base and the resultant signal is then further amplified by the remaining stages of the direct coupled amplifier 10 and appears as an output signal at the output terminal 11**.

The summing junction 18 is connected to the balancing circuitry by way of a resistor 40 to a first contact 44 cooperating with a grounded armature **45*a* of a vibrator 45 including a field coil 45*b* supplied with an alternating current potential of suitable frequency. The direct current signal potential taken from the summing junction 18 is converted into a pulsating direct current potential having an amplitude proportional to the error signal produced at the junction 18. This pulsating signal is applied by way of the coupling capacitor 41 to the base of an input NPN transistor 43 of the A.C. stabilized amplifier 12. Transistor 43 is connected in an emitter-follower configuration having its collector connected to ground and its emitter coupled by way of a resistor 47 to the negative side of a supply battery 48, the positive side of which is connected to ground. As a result of that emitter-follower connection the input impedance of the A.C. stabilizing amplifier 12 is sufficiently high to accomplish the following results which are made necessary by the very high input impedance of the amplifier 10**.

In order to maintain the very high input impedance of amplifier 10, resistor 40 must be selected to be of high resistance value so that such input impedance is not decreased when the armature 45*a* grounds the contact 44. With resistor 40 of high resistance value, the potential applied across the input of the A.C. amplifier 12 is a function of the input impedance of that amplifier. Thus, the relatively high input impedance of the emitter-follower connection of transistor 43 maintains a high value of input signal to amplifier 12 maintaining a high output potential from an output terminal 53 of that amplifier. In addition, as a result of that high input impedance the value of capacitor 41 may be decreased as compared with such capacitors as used in prior A.C. stabilizing transistor amplifiers. Such smaller valued coupled capacitor 41 may be utilized for the same reasons described with relation to capacitor 21 and the input advantages of the smaller value apply equally to capacitor 41.

The pulsating direct current signal applied to amplifier 12 is amplifier by transistor 43 to produce a corresponding signal of the same phase which is then applied by way of its emitter and a direct connection to the base of a transistor 50. The collector of that transistor is connected by way of a resistor 51 to the negative side of the supply battery 48 and the emitter of transistor 50 is connected to ground to form a common-emitter configuration.

Thus, transistor 50 amplifies its input and the resultant signal is then further amplified by the several stages of the A.C. amplifier 12 to provide a modulated output signal at output terminal 53 which signal is in phase with the input signal applied to amplifier 12.

The output signal from the output terminal 53 is applied by way of a capacitor 70, a resistor 71 and a conductor 74 to a contact 44*a* of the vibrator 45. Since the contact 44*a* operates 180 degrees out of phase with the contact 44, the amplified output signal at conductor 74 is demodulated to a unidirectional signal. That demodulated signal is supplied by way of a conductor 75 and a resistor 76 to the input of direct coupled amplifier 10 to serve as a balancing or stabilizing signal for that amplifier.

Referring again to the modulated output signal appearing at terminal 53, that signal is applied as a feedback by a tuned frequency selective network 55 to the input of the amplifier 12. The feedback network comprises a resistor 56 having one end connected to terminal 53 and the other end connected to a resistor 57 and to a capacitor 58 parallel connected to each other to form a first parallel connection. The other end of that first parallel connection is coupled to a junction 59 which is common to a second parallel connection comprising a resistor 60 and a capacitor 61 and to a third parallel connection comprising a resistor 62 and a capacitor 63. The side of the third parallel connection remote from junction 59 is connected to ground while the side of the second parallel connection remote from junction 59 is connected by way of a conductor 65 to the input of amplifier 12.

It will be understood by those skilled in the art that the tuned frequency network 55 comprising the three parallel resistance-capacitance connections may have its components selected so that the network is tuned to pass a very narrow band of frequencies and to reject all other frequencies. Since the output of the amplifier 12 is in phase with its input, the frequencies passed by the network 55 constitute a positive feedback and thus such frequencies will be further amplified. The frequencies that are not within the very narrow band of positive feedback frequencies serve no useful purpose in the stabilizing operation while they do produce errors and for this reason should be rendered substantially ineffective. Specifically the amplifier 12 may generate noise signals of frequencies grtater than such band pass frequencies and such noise will be rejected by the filter 55 and thus will not be further amplified. In this manner, these noise signals, without further amplification, will have little affect on the direct coupled amplifier 10. In addition, those frequencies less than the band pass filter frequency may have the effect of producing undesirable instabilities, noise, and low frequency beat signals in the closed loop circuit including the summing junction. Sinch such frequencies are rejected by the filter 55, it will be understood that they will have little effect in producing such undesirable results. In this manner, intermodulation distortion within the amplifier system will be maintained at a substantially low value. The frequency band accepted by network 55 is particularly narrow because of the high input impedence of the emitter-follower configuration of transistors 43 and 50. Because of this narrow frequency band pass, almost all extraneous noise is rejected and thus not amplified by direct coupled amplifier 10 with a resultant high signal noise ratio and very low noise being presented to output terminal 11 of amplifier 10 which allows signals of very low or low magnitude to be meaningful.

Now that the principles of the invention have been explained, it will be understood that many modifications may be made. For example, the transistors of the amplifier system may be either of the NPN type or of the PNP type depending on the particular application desired. In addition, the modulator-demodulator comprising the vibrator 45 may instead be a solid-state chopper, or any other modulator-demodulator known in the art.

What is claimed is:

1. A stabilized direct coupled amplifier system comprising a signal input terminal, a summing junction and output terminal, input circut means connected between said signal input terminal and said summing junction, a multistage direct coupled transistor amplifier having an input stage including a first and a second transistor and having an output stage connected to said output terminal, a feedback circuit connected between said output terminal and said summing junction, stabilizing means including an A.C. stabilizing transistor amplifier coupled between said summing junction and said input stage of said multistage direct coupled amplifier, and a positive feedback network connected between said summing junction and said input stage in parallel with said A.C. amplifier and comprising a band-pass filter for passing desirable feedback frequencies and for rejecting all the frequencies whereby said rejected frequencies are not fed back for further amplification by A.C. amplifier to effectively suppress said rejected frequencies thereby to suppress noise, instabilities, and low frequency beat signals otherwise produced by said rejected frequencies, coupling means including a blocking capacitor connected between said summing junction and said input stage in parallel with said stabilizing means, and said first and said second transistor each being connected in an emitter-follower configuration with the emitter of said first transistor being directly connected only to the base of said second transistor to provide an input impedance for said multistage direct coupled amplifier of relatively very high value and said blocking capacitor being selected to have a low capacitance value whereby the frequency response of said amplifier system is substantially increased and its drift and noise is substantially decreased without decreasing the overall gain of said amplifier system, and said A.C. amplifier having an input transistor connected in an emitter-follower configuration to provide a relatively high input inpedance for said A.C. amplifier thereby to maintain said relatively very high input impedance of said direct coupled amplifier and to maintain a high value of input signal to said A.C. amplifier and to maintain the relatively narrow frequency band pass of said feedback network.

2. The amplifier system of claim 1 in which there is provided means connecting the collectors of said first and said second transistor together and to ground potential, and in which ther is provided a resistor and a capacitor parallel connected with one end of the parallel connection being coupled to said emitter of said second transistor and the other end of said parallel connection being coupled to an input of the next succeeding stage of said multistage direct coupled amplifier.

References Cited

UNITED STATES PATENTS

| | | | |
|---|---|---|---|
| 2,968,005 | 1/1961 | Patmore | 330—9 |
| 3,210,681 | 10/1965 | Rhodes | 330—32 |
| 2,924,782 | 2/1960 | Zomber | 330—109 |
| 3,147,446 | 9/1964 | Wittenberg | 330—9 |

OTHER REFERENCES

Article on Transistor A.C. Amplifier with High Input Impedance, by James J. Davidson, Semiconductor Prods., March 1960, pp. 42–47.

ROY LAKE, *Primary Examiner.*

NATHAN KAUFMAN, *Examiner.*